United States Patent
Pereira (10) Patent No.: US 7,228,378 B1
(45) Date of Patent: Jun. 5, 2007

(54) ENTRY LOCATION IN A CONTENT ADDRESSABLE MEMORY

(75) Inventor: Jose P. Pereira, Cupertino, CA (US)

(73) Assignee: NetLogic Microsystems, Inc., Mountain View, CA (US)

(*) Notice: Subject to any disclaimer, the term of this patent is extended or adjusted under 35 U.S.C. 154(b) by 598 days.

(21) Appl. No.: 10/789,705

(22) Filed: Feb. 27, 2004

Related U.S. Application Data (60) Provisional application No. 60/477,737, filed on Jun. 11, 2003.

(51) Int. Cl.
*G06F 12/00* (2006.01)
*G11C 15/00* (2006.01)

(52) U.S. Cl. .......................... 711/108; 365/49

(58) Field of Classification Search ............... None
See application file for complete search history.

(56) References Cited

U.S. PATENT DOCUMENTS

| | | | |
|---|---|---|---|
| 5,920,886 A | 7/1999 | Feldmeier | |
| 6,199,140 B1 | 3/2001 | Srinivasan et al. | |
| 6,289,414 B1 | 9/2001 | Feldmeier et al. | |
| 6,460,112 B1 | 10/2002 | Srinivasan et al. | |
| 6,539,455 B1 | 3/2003 | Khanna et al. | |
| 6,996,664 B2 * | 2/2006 | Giambalvo | 711/108 |

* cited by examiner

*Primary Examiner*—Reginald Bragdon
*Assistant Examiner*—Mehdi Namazi
(74) *Attorney, Agent, or Firm*—Shemwell Mahamedi LLP (57) ABSTRACT

A method for performing a search in a content addressable memory ("CAM") device comprising comparing a search key with compound entries in a CAM array, wherein at least one of the compound entries includes (i) a ternary CAM word having a data word and a mask word, and (ii) a mask specifier that indicates the state of the mask word, and wherein the search key includes (i) a search word component, and (ii) a search mask component, and wherein the ternary CAM word is compared with the search word and the mask specifier is compared with the search word component; and generating a match signal associated with an compound entry that matches the search key.

18 Claims, 4 Drawing Sheets

ENTRY LOCATION IN A CONTENT ADDRESSABLE MEMORY

CROSS-REFERENCE TO RELATED APPLICATIONS

This application claims priority from, and hereby incorporates by reference, U.S. Provisional Application No. 60/477,737, filed Jun. 11, 2003, and entitled "Method for Finding a Longest Prefix Match in a Ternary CAM."

FIELD OF THE INVENTION

The present invention relates to content addressable memory ("CAM") devices, and more particularly to search operations within CAM devices.

BACKGROUND

Content addressable memory (CAM) devices are often used in network switching and routing systems to determine forwarding destinations and permissions for data packets. A CAM device can be instructed to compare a search key obtained from an incoming packet with contents of a forwarding or classification database (referred to collectively herein as a search database) stored in an associative storage array within the CAM device. If the search key matches an entry in the database, the CAM device generates a match address that corresponds to the matching entry, and asserts a match flag to signal the match. The match address is then typically used to address another storage array, either within or separate from the CAM device, to retrieve forwarding information for the packet.

The search database is managed by a host device, which issues read and write instructions to the CAM device to effect entry insertion and deletion operations. In some cases, the host device requires the address of a specific CAM entry in order to complete a database management operation. For example, the host device typically identifies an entry to be overwritten or deleted by providing the address of the entry to the CAM device. As another example, in CAM devices having physical priority ordering (i.e., the priority of a given entry is dependent upon its location within the CAM device), insertion of an entry often requires relocation of selected entries to lower priority storage locations, and therefore typically requires determination of the address of the highest-priority one of the entries to be relocated.

Determining the address of a particular entry in a binary CAM (i.e., a CAM in which each bit of each entry is either a '1' or '0') is straightforward, as a conventional search for the entry will yield a match address that corresponds to the storage location. In a ternary CAM device, matters are complicated by the fact that individual bits of an entry may be assigned a don't care state, 'X', in addition to the binary '1' and '0' states. More specifically, each bit position in a ternary CAM word (i.e., the value that, when stored in the ternary CAM array, constitutes a ternary CAM entry) is typically represented by two bits: a data bit which is compared with a corresponding bit of a search value, and a mask bit which is used to selectively prevent (i.e., mask) the data bit comparison from affecting the overall match result for the entry. Because the mask bit is generally not compared with the search value, the state of the mask bits within a ternary CAM entry usually cannot be discerned through a search operation. Further, because a set mask bit (i.e., set to a masking state) prevents a mismatch between the corresponding data bit and search bit from being signaled, the specific state of the data bits may not be inferred from a single search. Thus, if the data component, D, of a given four-bit ternary CAM entry is 1100 and the mask component, M, of the ternary CAM entry is 0011 (a '1' in a given mask bit position indicating that the corresponding data bit is masked), the entry is indistinguishable, from a search perspective, from entries in which D=11XX, M=XX11 ('X' indicating that both '1' and '0' values may be used in the bit positions without affecting the search result); D=1XXX, M=X111; and D=X1XX, M=1X11; and D=XXXX, M=1111. Thus, a problem is presented as to how to determine the storage address of a ternary CAM entry having a particular data component and mask component.

In one prior-art approach, the entry location problem is avoided altogether through use of a separate, off-chip entry map that indicates the storage address of each entry within a ternary CAM device. More specifically, when an entry is written to a given address within the ternary CAM array, the host device creates a corresponding entry in the storage map to hold the address and a copy of the ternary CAM entry. Thereafter, when the storage address of a particular ternary CAM entry is required, the host device traverses the storage map to find the desired entry copy and corresponding CAM address. Unfortunately, the creation, maintenance and traversal of the storage map increases the processing load of the host device which, in many cases, is already heavily burdened with other system management operations.

BRIEF DESCRIPTION OF THE DRAWINGS

The present invention is illustrated by way of example, and not by way of limitation, in the figures of the accompanying drawings in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention. Additionally, the interconnection between circuit elements or blocks may be shown as buses or as single signal lines. Each of the buses may alternatively be single signal lines, and each of the single signal lines may alternatively be buses. Each of the active low signals may be changed to active high signals as generally known in the art. The term "exemplary" is used herein to mean but an example, and not a preference or requirement.

In embodiments of the present invention a ternary CAM array is loaded with compound entries that each include a conventional ternary CAM word and a mask specifier that indicates the state of the mask bits in the corresponding ternary CAM word. During a specialized search operation referred to herein as an entry location operation, a search key having a search word component and a search mask component is compared with the compound entries of the CAM array. If the search word component of the search key matches a ternary CAM word of a given compound entry, and a mask component of the search key matches the mask specifier of the compound entry, then a match is signaled on the corresponding match line, thereby enabling generation of a match address that corresponds to the location of the compound entry. Assuming that the search word and search mask components of the search key correspond to the data and mask components of a ternary CAM word whose storage location is needed, the match address constitutes the desired entry location and may therefore be used to carry out insertion, deletion or other database management operations.

In one embodiment, the ternary CAM word component of a compound entry includes an N-bit data field and an N-bit mask field, and the mask specifier value is an N-bit duplicate of the mask field. In an alternative embodiment, the mask specifier is an encoded value (e.g., having fewer than N bits) that indicates which of the bits of the N-bit mask field are set. In an alternative embodiment, the ternary CAM word is a quaternary value having N pairs of X and Y bits and in which each X-Y bit pair collectively indicates a logical '1' state, a logical '0' state or a don't care state. In such an embodiment, the mask specifier may include N bits each set to indicate a logic '1' or a '0' state according to whether a corresponding one of the X-Y bit pairs indicates a don't care state. Also, the mask specifier may be supplied to the ternary CAM device by a host device as part of a write data value that additionally includes the corresponding ternary CAM word, or the ternary CAM device may itself generate or otherwise derive the mask specifier from an incoming write data value.

Figure 1:
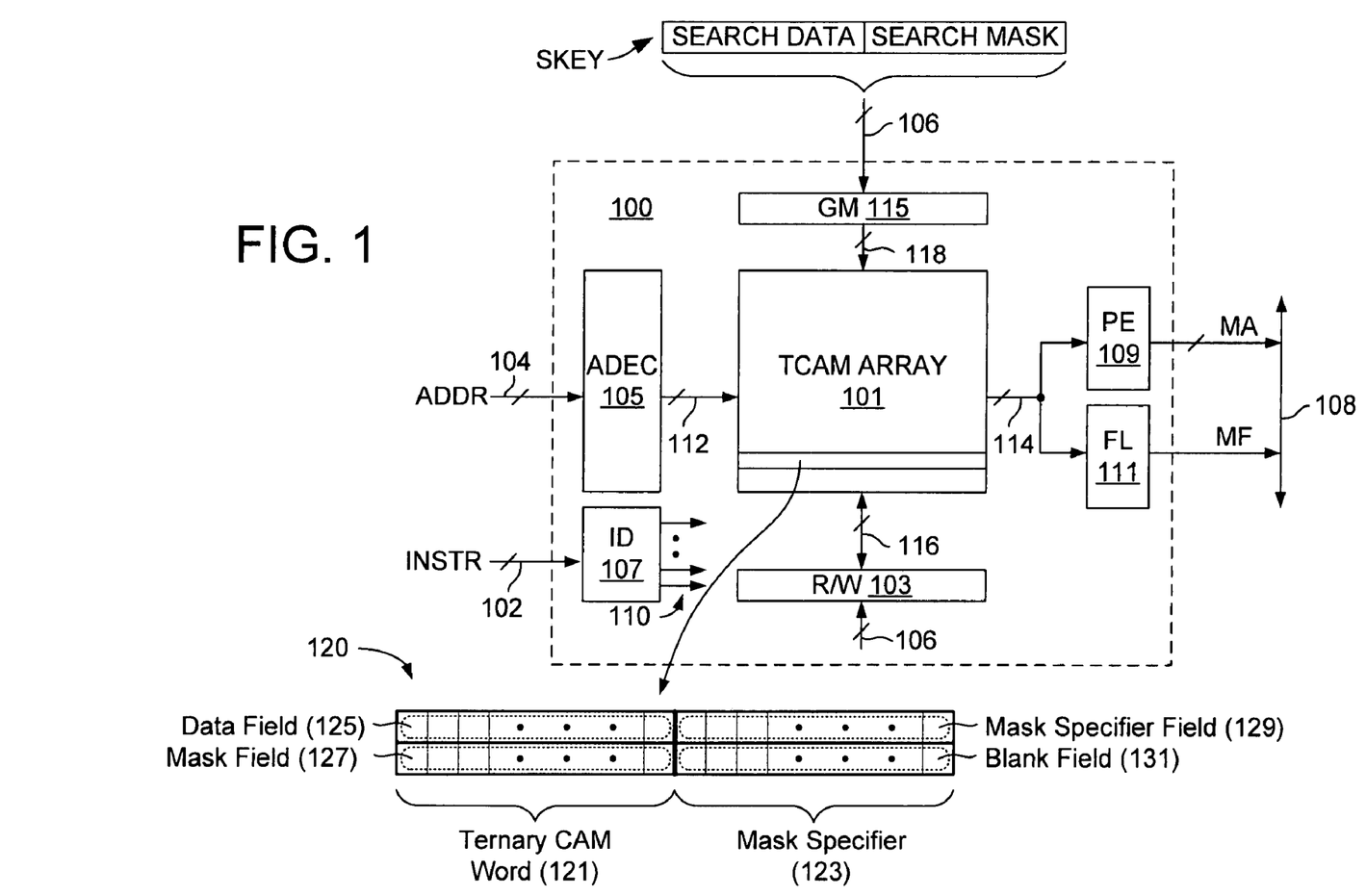
FIG. 1 illustrates an entry location operation and an exemplary format of compound entries within a ternary CAM device according to an embodiment of the invention.

FIG. 1 illustrates an entry location operation and an exemplary format of compound entries within a ternary CAM device 100 according to an embodiment of the invention. The CAM device 100 and variations thereof disclosed below may be implemented in a dedicated integrated circuit (IC) device or as a portion of an IC device (or IC package) that includes other circuit blocks or features, such as a general or special purpose processor (e.g., network processor or digital signal processor), microcontroller, memory controller, one or more other CAM devices and so forth. The CAM device 100 includes a ternary CAM array 101, read/write circuit 103, address decoder 105, instruction decoder 107, priority encoder 109, flag logic 111 and global mask circuitry 115. A number of other circuit blocks, not shown, may also be included within the CAM device 100 including, without limitation, input/output drivers, status registers, configuration circuits, associated storage, error checking and correction circuitry and so forth. Also, while a single ternary CAM array 101 is shown, the CAM device 100 may include multiple ternary CAM arrays 101 and associated circuitry.

Instructions such as read, write and search instructions are issued to the CAM device 100 by a host processor, network processor or other control device (not shown in FIG. 1 and referred to generally herein as a host device) via an instruction bus 102. The instruction decoder 107 decodes incoming instructions and responsively issues signals 110 to other circuit blocks within the CAM device 100 to effect execution of the instructed operation. In the case of read and write instructions, the host device may additionally issue address values to the CAM device 100 via address bus 104 to specify storage locations to be accessed in the ternary CAM array 101, with read data and write data being transferred between the CAM device 100 and the host device via data bus 106. In the case of search instructions, including the aforementioned entry location instructions, the host device may additionally issue search keys to the CAM device via data bus 106 or via a dedicated search key bus. In the embodiment of FIG. 1, search results, including a match flag and match address, are returned to the host device via a result bus 108 and may additionally, or alternatively, be provided to an associated storage (not shown) or other device. In alternative embodiments, any one or more of the address bus, instruction bus, data bus and result bus may be eliminated and the signals carried thereon multiplexed onto another of the buses.

The ternary CAM array 101 is populated with ternary CAM cells arranged in rows and columns. Precharged match lines 114 are coupled to respective rows of the CAM cells, and pairs of bit lines 116 and pairs of compare lines 118 are coupled to respective columns of the CAM cells. Together, the bit line pairs form a data port for read/write access to address-selected rows of ternary CAM cells within the ternary CAM array 101, and the compare line pairs form a compare port for inputting search keys to the ternary CAM array 101 during compare operations. The ternary CAM cells themselves are specialized store-and-compare circuits each having a pair of storage elements to store a constituent bit pair of a ternary CAM word (i.e., mask bit and data bit, or encoded X and Y bits as discussed below), and a compare circuit for affecting the state of a match line according to the stored bit pair and a search bit provided in complementary fashion on a compare line pair. In one embodiment, the compare circuits within the ternary CAM cells of a given row are coupled in parallel to the match line for the row, with each compare circuit switchably forming a discharge path to discharge the match line if the stored bit pair indicates an unmasked state (e.g., mask bit set to zero) and if the stored bit pair does not match the search bit (i.e., the data bit has a different state than the search bit). By this arrangement if any one bit pair of a ternary CAM word is unmasked and does not match the corresponding bit of the search key, the match line for the row is discharged to signal the mismatch condition. If all the bit pairs of the ternary CAM word match the corresponding bits of the search key, the match line remains in its precharged state to signal a match. Because a search key is presented to all the rows of ternary CAM cells in each compare operation, a rapid, parallel search for a matching ternary CAM word is performed.

Still referring to FIG. 1, the match lines 114 are provided to the priority encoder 109 and flag logic 111. During a search operation, the priority encoder 109 generates a match address (MA) according to the state of the match lines and a predetermined prioritizing policy. The prioritizing policy may be fixed by design (e.g., matches at lower numbered addresses within the ternary CAM array 101 take priority over matches at higher numbered addresses, or vice versa) or may be programmable (e.g., mode selectable or pro- grammed priority per ternary CAM entry). The flag logic 111 generates a match flag (MF) that indicates, for a given search operation, whether a match has been detected (e.g., logically ORing or NORing the states of the match lines), and may additionally generate a multiple match flag to indicate that two or more matches have been detected. During write operations, the priority encoder 109 and flag logic 111 may be used to generate, based on validity bits or encoded values stored or associated with each row of CAM cells, a next free address (NFA) that indicates a highest-priority unoccupied storage location within the ternary CAM array and one or more flags that indicate whether the ternary CAM array 101 is full or almost full.

During a read or write operation within the CAM device 100, the address decoder 105 receives an address from the address bus 104 (or from an address source within the CAM device 100) and activates a corresponding one of word lines 112 to access a row of CAM cells. In a read operation, each of the ternary CAM cells within the accessed row outputs the bits of the stored bit pair onto the bit lines 116, thereby enabling the ternary CAM word to be read out via the data port (i.e., amplified by sense amplifier circuitry within the read/write circuit 103 and output onto the data bus 106). Conversely, in a write operation, write driver circuitry within the read/write circuit outputs a write data value onto the bit line pairs to store an entry, including the aforementioned compound entry, within the accessed row of ternary CAM cells. In one embodiment, two pairs of bit lines are provided to each column of CAM cells to enable the corresponding bit pair of a ternary CAM word to be read or written in a single access operation. In an alternative embodiment, a single pair of bit lines may be provided per CAM cell column to enable time-multiplexed access to the ternary CAM word (i.e., bits of a given bit pair transferred one after the other). In such an embodiment, two word lines 112 may be provided for each row of CAM cells, one to enable access to a first bit (e.g.; a data bit) and the other to enable access to a second bit (e.g., a mask bit) within each CAM cell of the row. In another alternative embodiment, the bit lines may be omitted altogether, and the compare lines used in time-multiplexed fashion for either read/write access or search key delivery.

An exemplary format for a compound entry stored within the ternary CAM array 101 is shown at 120. The compound entry includes a ternary CAM word component 121 and a mask specifier component 123. In the embodiment shown, the ternary CAM word component itself includes a data field 125 (i.e., set of N data bits) and a corresponding mask field 127 (set of N mask bits). Each data bit and mask bit form a ternary bit pair that is stored within a respective CAM cell of a given row. In the embodiment shown, the mask specifier component of the compound entry includes a mask specifier field 129 (i.e., a set of M mask specifier bits) and a blank field 131. Each mask specifier bit and blank field bit form a bit pair that is stored within a respective CAM cell within the same row as the bit pairs that constitute the ternary CAM word. The mask specifier field indicates the state of the constituent bits of the mask field, and the blank field is set to a predetermined state (e.g., all '0') to prevent any of the bits of the mask specifier from being masked.

The global mask circuit 115 is used to selectively prevent selected bits of a search key (SKEY) from being driven onto the compare lines, thus preventing the ternary CAM cells in the corresponding column from affecting the state of the match signals 114. In one embodiment, when an entry location instruction is detected by the instruction decoder 107, the instruction decoder 107 issues a signal to the global mask circuit 115 to unmask all search key bit positions. Consequently, a search key having both a search data component and a search mask component (i.e., provided for entry location purposes) is supplied to the ternary CAM array 101 for comparison with compound entries stored therein. By contrast, when other search instructions are received, the instruction decoder 107 may issue a signal to the global mask circuit 115 to prevent at least the compare lines otherwise driven by the search mask component of a search key from being driven, thereby preventing the mask specifier components of compound entries from affecting the search results. Note that the entry location instruction may be considered as a class of search instruction. For example, in embodiments in which part of the search instruction operation code (or associated operand) specifies a global mask value to be applied by the global mask circuit 115, the entry location instruction is, in effect, a search instruction having a global mask specifier that specifies no masking in any bit position (or at least no masking in the search mask bit positions).

Figure 2:
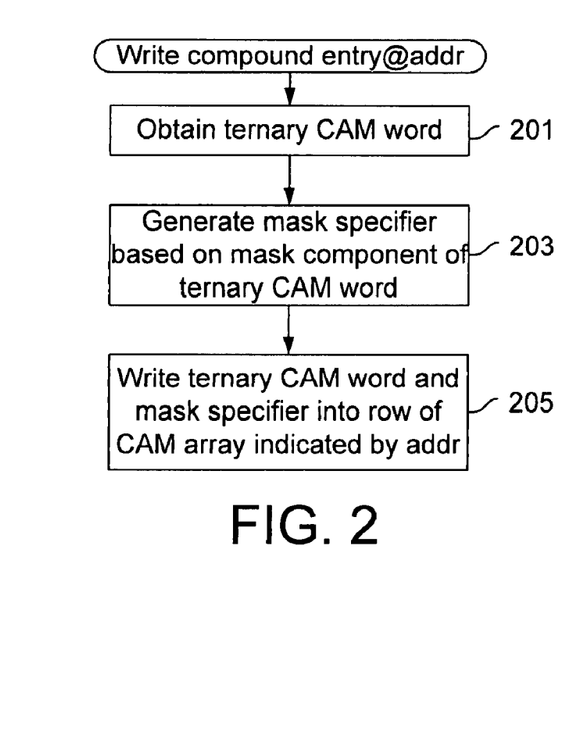
FIG. 2 is a flow diagram for writing a compound entry at a specified address within the ternary CAM device of FIG. 1.

FIG. 2 is a flow diagram for writing a compound entry at a specified address within the ternary CAM device of FIG. 1. Initially, at block 201, the host device obtains a ternary CAM word (e.g., by extracting selected bits from a packet or packet header and/or by obtaining a mask value). At block 203, the host device generates the mask specifier based on the mask component of the ternary CAM word. At block 205, the host device issues a write instruction to the CAM device together with the specified address, ternary CAM word and mask specifier, thus instructing the CAM device to write a compound entry (i.e., formed by the ternary CAM word and mask specifier) into the address-specified row of ternary CAM cells. The ternary CAM word and mask specifier may be provided to the CAM device in a single transfer operation or in a sequence of one or more transfers, depending on the width of the compound entry and the width of the bus used to deliver the compound entry to the CAM device. Also, in an alternative embodiment, the generation of the mask specifier may be performed by the CAM device itself rather than the host device. Such an embodiment is described below in further detail. Further, rather than obtaining a ternary CAM word at block 201, the host device may obtain a data field component of the ternary CAM word and an encoded mask value (e.g., a prefix in an internet protocol (IP) such as an IPv4 prefix or an IPv6 prefix that indicates the number of most-significant-bits of the data field component that are to be unmasked and, by implication, the number of least-significant bits of the data field component that are to be masked). The host device may deliver the encoded mask value to the CAM device at block 205, with the CAM device itself generating the mask field component of the ternary CAM word therefrom.

Figure 3:
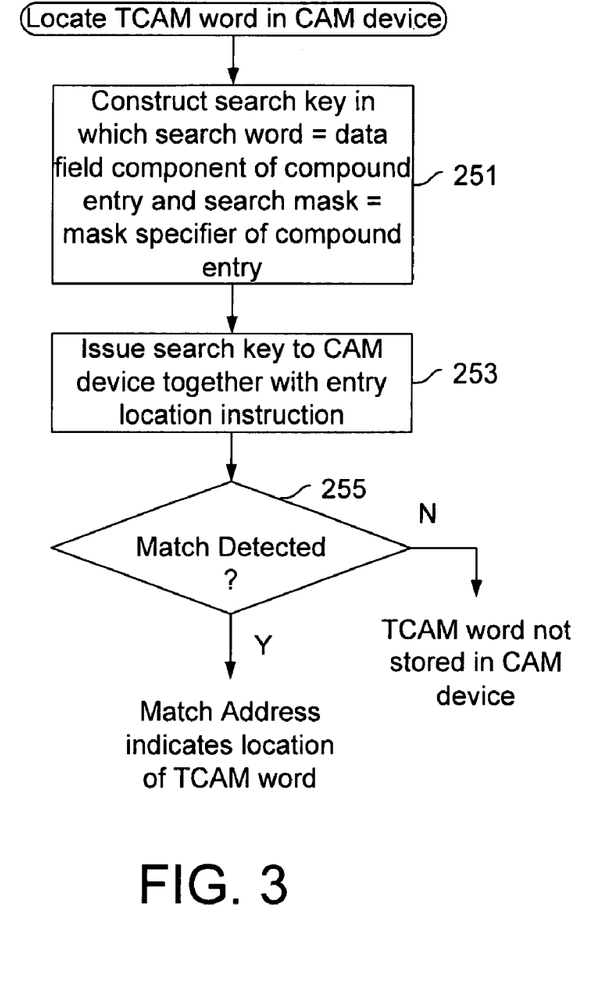
FIG. 3 is a flow diagram for an entry location operation within the CAM device of FIG. 1.

FIG. 3 is a flow diagram for an entry location operation within the CAM device of FIG. 1. Initially, at block 251, the host device generates (or looks up or otherwise obtains) a search key in which the search word is the data field component of the compound entry whose address is sought (i.e., the target entry) and in which the search mask is the mask specifier of a compound entry. At block 253, the search key is issued to the CAM device 101 together with an entry location instruction (or search instruction that indicates that the search mask component of the search key is not to be masked). At decision block 255, the host device inspects the match flag to determine whether a match was detected. If a match flag indicates a match, then the corresponding match address indicates the storage address, within the CAM device, of the key-matching compound entry and therefore the ternary CAM word component thereof. If the match flag indicates a non-match condition, then the ternary CAM word is not stored in the CAM device.

The write and entry location operations diagrammed in FIGS. 2 and 3 may be used to effect more complex operations, including entry deletion and entry insertion operations. For example, to delete a specific ternary CAM word from CAM device 101, the host device may execute the entry location operation of FIG. 3 to obtain the address of the ternary CAM word, then issue a delete instruction specifying the address of the entry (the delete instruction, for example, causing the CAM device to set the content of the address-selected row of CAM cells to a predetermined null-indicating value, or to clear a validity bit associated with the row of CAM cells). For another embodiment, a single delete and entry location operation may be performed by CAM device 101 in response to a single instruction. For example, the located address of the ternary CAM word may be fed back within CAM device 101 to address decoder 105 to access the located entry and then perform a deletion. Similarly, to insert a ternary CAM word at a location that is dependent upon the storage location of another ternary CAM word (e.g., a lower priority CAM word), the host device may execute the entry location operation of FIG. 3 to obtain the address of the other ternary CAM word, then execute a sequence of read and write operations to relocate the other ternary CAM word and yet lower priority ternary CAM words to lower priority addresses, and thereafter execute the write operation of FIG. 2 to write a compound entry (i.e., a compound entry that includes the ternary CAM word to be inserted) at the address obtained in the entry location operation.

Figure 4:
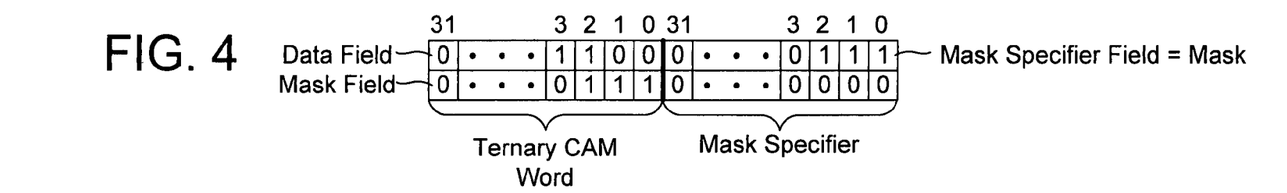
FIG. 4 illustrates an exemplary compound entry in a mask duplication format.

FIG. 4 illustrates an exemplary compound entry format, referred to herein as a mask duplication format. As shown, the ternary CAM word component includes a 32-bit data field and a corresponding 32-bit mask field. The mask specifier component includes a 32-bit mask specifier field that is a duplication of the mask field, and a blank field set to a non-masking state. Thus, in an entry location operation executed to locate a compound entry in the mask duplication format, the search key is generated with a search mask that matches the mask field of the ternary CAM word whose address is sought. Although 32-bit data, mask and mask specifier fields are shown, such fields may have more or fewer bits in alternative embodiments.

Figure 5:
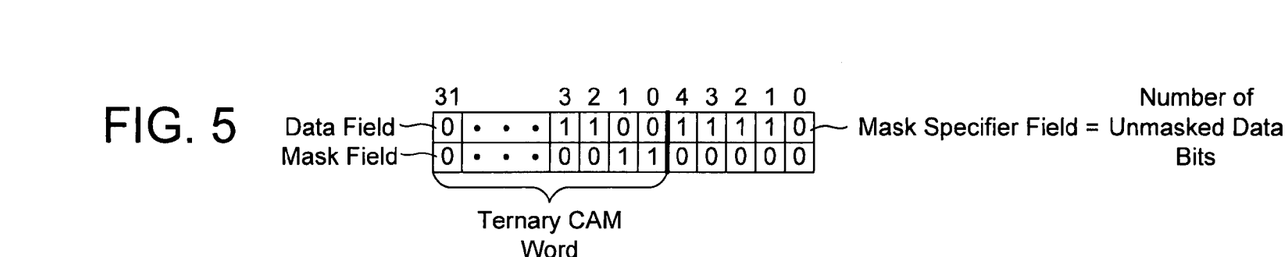
FIG. 5 illustrates an exemplary compound in an encoded-mask format.

FIG. 5 illustrates another exemplary compound entry format, referred to herein as an encoded-mask format. A compound entry in the encoded mask format includes a ternary CAM word component in the same format as in the mask duplication format, together with a mask specifier component having an encoded mask specifier and a blank field set to a non-masking state. In the exemplary embodiment shown, the mask specifier corresponds to an IP prefix (i.e., indicating the number of unmasked bits in the data field and, by implication, the number of bits in the masking state in the mask field). Thus, as only the two least significant bits of the data field are masked, thirty bits of the data field are unmasked, so that the mask specifier field is a five-bit field (more bits may be provided in alternative embodiments) set to 30 ('11110') to indicate the thirty unmasked bits. In an entry location operation executed to locate a compound entry in the encoded-mask format, the search key is generated with a search mask in the encoded format. Other encoding schemes may be used in alternative embodiments without departing from the spirit and scope of the invention.

Figure 6:
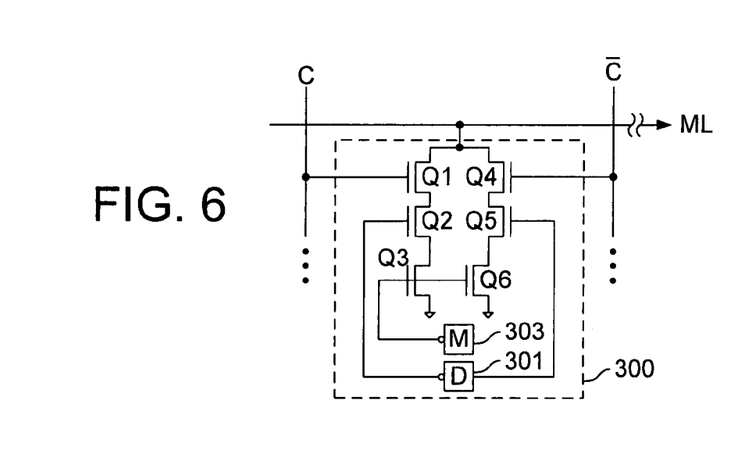
FIG. 6 illustrates an exemplary ternary CAM cell 300 in which data and mask bits of a ternary CAM word, and mask specifier and blank bits of a mask specifier, may be stored.

FIG. 6 illustrates an exemplary ternary CAM cell 300 in which data and mask bits of a ternary CAM word (and mask specifier and blank bits of a mask specifier) may be stored. The ternary CAM cell 300 includes transistors Q1, Q2, Q3, Q4, Q5 and Q6, data storage element 301 and mask storage element 303. When the CAM cell is used to store a bit of a mask specifier field and a corresponding blank bit, the bit of the mask specifier field is stored in the data storage element 301, and the blank (e.g., '0') bit is stored in the mask storage element 303. As with other CAM cell embodiments described herein, the data and mask storage elements 301 and 303 may be any type of storage element, including volatile storage elements (e.g., static random access memory (SRAM) or dynamic random access memory (DRAM) storage elements) and non-volatile storage elements. Transistors Q1, Q2 and Q3 are coupled in series between a precharged match line (ML) and ground, and have gate terminals coupled to receive, respectively, a comparand bit (C), complemented output of the data storage element 301 (/D) and complemented output of the mask storage element 303 (/M). Similarly, transistors Q4, Q5 and Q6 are coupled in series between the match line and ground, and have gate terminals coupled to receive, respectively, a complement comparand bit (/C), a non-complemented output of the data storage element 301 (D) and the complemented output of the mask storage element 303 (/M). By this arrangement, if the content of the mask storage element is a '1', transistors Q3 and Q6 are switched off, thereby preventing the CAM cell from discharging the match line. That is, if the mask storage element 303 stores a bit in the masking state, the CAM cell 300 is prevented from affecting the match result. By contrast, if the content of the mask storage element is a '0', transistors Q3 and Q6 are switched on, thereby enabling the match line to be discharged if a mismatch exists between a search key bit, S, (i.e., indicated by complementary bits C and /C, and in which S=C) and the data bit, D, stored in the data storage element 301. More specifically, if D=1 and S=0, then transistors Q4 and Q5 are switched on to discharge the match line (i.e., via Q6), and if D=0 and S=1, then transistors Q1 and Q2 are switched on to discharge the match line (i.e., via Q3). Conversely, if the search key bit and data bit match, at least one transistor in pairs Q1/Q2 and Q4/Q5 will be switched off, thereby isolating the match line from ground and signaling a match condition, at least as to CAM cell 300.

Figure 7:
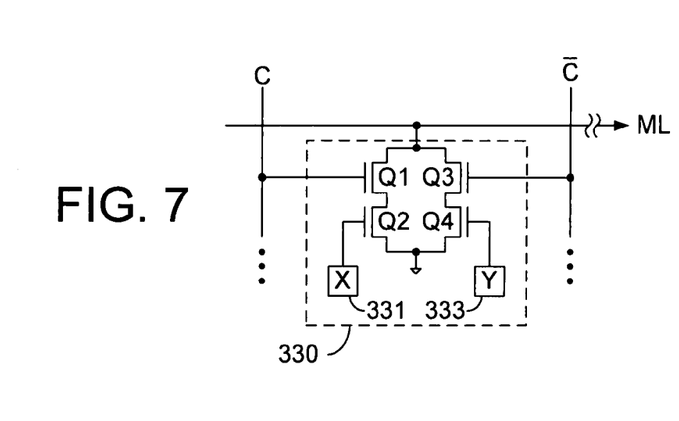
FIG. 7 illustrates an alternative ternary CAM cell 330 that may be used in embodiments of the invention.

FIG. 7 illustrates an alternative ternary CAM cell 330 that may be used in embodiments of the invention. Prior to storing a mask and data bit pair of a ternary CAM word in the CAM cell 330, the mask and data bit pair of a ternary CAM word are converted to X and Y bits according to the following logic:

TABLE 1

| Mask Bit | Data Bit | X | Y |
|---|---|---|---|
| 0 | 0 | 1 | 0 |
| 0 | 1 | 0 | 1 |
| 1 | 0 | 0 | 0 |
| 1 | 1 | 0 | 0 |

The above conversion is referred to as an XY conversion and may be performed by the host device when constructing an entry to be stored within the CAM array, or by conversion circuitry within the CAM device itself (e.g., within read/write circuit 103 of FIG. 1).

The CAM cell 330 includes a first storage element 331 to store the 'X' bit of the XY conversion result, and a second storage element 333 to store the 'Y' bit of the XY conversion result, together with a compare circuit formed by transistors Q1, Q2, Q3 and Q4. Transistors Q1 and Q3 are coupled to receive the C and /C bits, respectively (i.e., complementary representation of a search key bit, S), and transistors Q2 and Q4 are coupled to receive the X bit and Y bit from the storage elements 331 and 333 respectively. Referring to the XY conversion logic of table 1, and FIG. 7, when the mask bit is in a masking state (e.g., a '1'), then both the X and Y bits are '0', thereby switching off transistors Q2 and Q4 and isolating the match line (ML) from ground (i.e., at least within the CAM cell 330). When the mask bit is in the non-masking state, then the X and Y bits constitute a complementary representation of the data bit in which X=/D and Y=D. Consequently, when the mask bit is in the non-masking state, and the search key bit does not match the data bit, then the match line will be discharged either through transistors Q1 and Q2 (i.e., S=1 and D=0, so that C=1 and X=1) or through transistors Q3 and Q4 (i.e., S=0 and D=1, so that /C=1 and Y=1). When the search key bit does match the data bit, then at least one transistor in pair Q1/Q2 and in pair Q3/Q4 is switched off, thereby preventing the CAM cell from discharging the match line.

When the CAM cell 330 of FIG. 7 is used within the CAM array 101 of FIG. 1, the format of the compound entry is changed to reflect the conversion of data and mask bits to X and Y bits. In one embodiment, the X and Y bits stored for each bit position of the mask specifier component ($X_{MS}$ and $Y_{MS}$) correspond to the X and Y bits that represent the ternary CAM word ($X_{TCW}$ and $Y_{TCW}$) as follows:

$X_{MS}$=/(/$X_{TCW}$*$Y_{TCW}$), and $Y_{MS}$=/$X_{TCW}$*/$Y_{TCW}$, where '/' indicates complement '*' indicates a logic AND operation.

Figure 8:
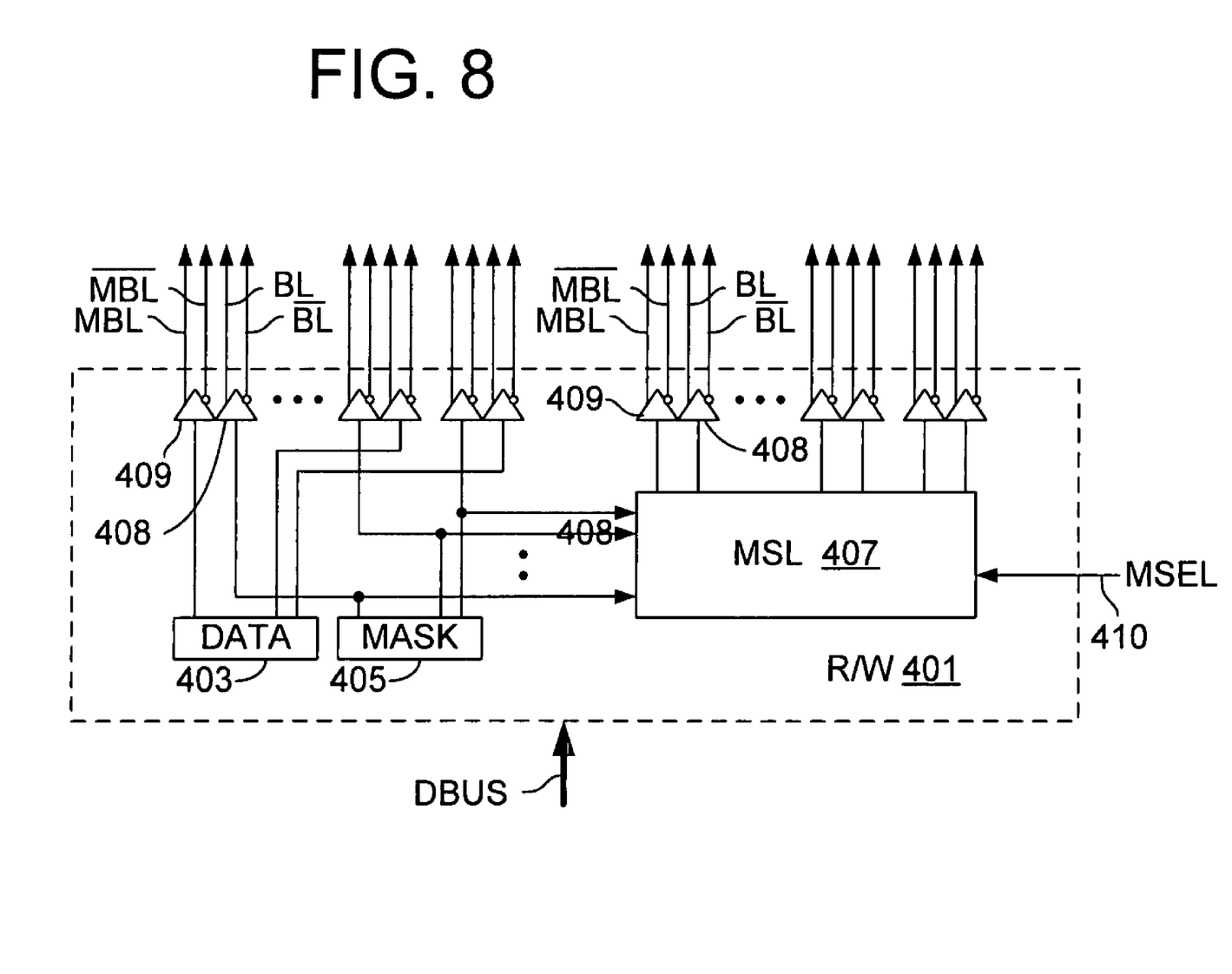
FIG. 8 illustrates an embodiment of a read/write circuit that may be used within the CAM device of FIG. 1 to generate the mask specifier component of a compound entry.

FIG. 8 illustrates an embodiment of a read/write circuit 401 that may be used within the CAM device 100 of FIG. 1 to generate the mask specifier component of a compound entry. In the embodiment shown, data field and mask field components of a ternary CAM word are delivered to the read write circuit 401 via a data bus (DBUS) and stored within data write register 403 and mask write register 405, respectively. The constituent bits of the data field are provided from the data write register 403 to respective bit line drivers 408 that, when enabled (e.g., by a strobe signal from the instruction decoder or other control circuit), output the indicated data in complementary fashion onto bit lines, BL and /BL, of the ternary CAM array. Similarly, the constituent bits of the mask field are provided from the mask write register 405 to respective bit line drivers 409 that, when enabled, output the indicated mask state in complementary fashion onto mask bit lines, MBL and /MBL, of the ternary CAM array. As discussed above, the mask bit lines and their corresponding bit line drivers may be omitted and the mask bit signals instead driven in time-multiplexed fashion on the bit lines BL and /BL. Also, the bit lines, BL and /BL or the mask bit lines, MBL and /MBL, may additionally be used to input search keys to the CAM array during search operations.

The read/write circuit 401 additionally includes mask specifier logic 407 to generate the mask specifier component of a compound entry. In one embodiment, the mask specifier logic 407 receives the mask signals from the mask write register 405 and generates a corresponding mask specifier field and blank field. When a compound entry is to be written in a duplicate-mask format, the mask specifier logic 407 may be omitted as the mask bits from the mask write register 405 themselves may be provided to bit line drivers 408 to drive the mask specifier field onto bit lines BL and /BL for storage in data storage elements within the ternary CAM array alongside the corresponding ternary CAM word. Non-masking values (e.g., logic '0' values) are driven onto the mask bit lines by bit line drivers 409 to effect storage of the blank field of the mask specifier. When a compound entry is to be written in an encoded-mask format, the mask specifier logic 407 may carry out the encoding operation, then provide the encoded-format mask specifier field to the bit line drivers 408 to be output to the CAM array.

In an embodiment in which an encoded-mask value is provided via the data bus, conversion circuitry within the read/write circuit 401 may be used to form the expanded mask field that is stored in the write mask register 405, with the encoded-mask value being provided to directly the bit line drivers 408 used to output the mask specifier field to the CAM array. Also, if the host device provides the ternary CAM word in an XY format, both the contents of the data write register 403 (which contains X bits) and mask write register 405 (which contains Y bits) are provided to the mask specifier logic 407 to enable generation of the corresponding X and Y bits of the mask specifier component of the compound entry. In an embodiment in which XY conversion is performed within the read/write circuit 401, the incoming mask value may be provided to the mask specifier logic 407 as shown, or X and Y bits of the ternary CAM word component, when generated, may be provided to the mask specifier logic 407. Also, a mode select signal 410 may be issued to the mask specifier logic 407 (e.g., in response to a configuration setting in a configuration register of the CAM device (not specifically shown) or in response to a signal from the instruction decoder) to control the operation of the mask specifier logic 407. For example, in one state, the mode select signal 410 may indicate that no encoding or other conversion is to be performed to generate the mask specifier component of the compound entry, and in other states (the mode select signal may be a multi-bit signal) may indicate one or more encoding or conversion operations to be performed by the mask specifier logic 407.

Although the invention has been described with reference to specific exemplary embodiments thereof, various modifications and changes may be made thereto without departing from the broader spirit and scope of the invention. The specification and drawings are, accordingly, to be regarded in an illustrative rather than a restrictive sense.

What is claimed is:

1. A method for performing a search in a content addressable memory ("CAM") device, the method comprising:
   comparing a search key with compound entries in a CAM array, wherein at least one of the compound entries includes (i) a ternary CAM word having a data word and a mask word, and (ii) a mask specifier that indicates the state of the mask word, and wherein the search key includes (i) a search word component, and (ii) a search mask component, and wherein the ternary CAM word is compared with the search word component and the mask specifier is compared with the search word component; and
   generating a match signal associated with a compound entry that matches the search key.

2. The method of claim 1, further comprising generating an address in the CAM array for the compound entry that matches the search key.

3. The method of claim 1, further comprising deleting the compound entry that matches the search key.

4. The method of claim 1, further comprising relocating the compound entry that matches the search key to another location in the CAM array.

5. A method for locating an entry in an array of ternary content addressable memory ("CAM") cells, the method comprising:
   determining that a first group of bits of a search key match a first group of bits of the entry of the CAM array, the first group of bits of the entry having an associated group of local mask bits; and concurrently determining that a second group of bits of the search key match a second group of bits in the entry of the CAM array, wherein the second group of bits of the entry comprises a representation of the local mask bits.

6. The method of claim 5, wherein the second group of bits of the entry comprise the local mask bits.

7. The method of claim 5, wherein the second group of bits of the entry comprise an encoding of the local mask bits.

8. The method of claim 5, further comprising generating a match signal associated with the entry.

9. The method of claim 5, further comprising generating an address for the entry.

10. The method of claim 5, further comprising deleting the entry.

11. The method of claim 5, further comprising relocating the entry in the ternary CAM array.

12. A method for locating an entry in an array of ternary content addressable memory ("CAM") cells, the method comprising:

performing a ternary compare operation between a first field of a search key and a ternary CAM word portion of the entry in the ternary CAM array, wherein the ternary CAM word portion of the entry includes a data word and a local mask word; and performing an unmasked compare operation between a second field of the search key and a mask specifier of the entry in the ternary CAM array, wherein the mask specifier comprises a representation of the local mask word.

13. The method of claim 12, wherein the mask specifier comprises the local mask word.

14. The method of claim 12, wherein the mask specifier comprises an encoding of the local mask word.

15. The method of claim 12, further comprising generating a match signal associated with the entry.

16. The method of claim 12, further comprising generating an address for the entry.

17. The method of claim 12, further comprising deleting the entry.

18. The method of claim 12, further comprising relocating the entry in the ternary CAM array.

* * * * *